(12) United States Patent
Groeninger et al.

(10) Patent No.: US 9,079,318 B2
(45) Date of Patent: Jul. 14, 2015

(54) SELF-ALIGNING PICK-UP HEAD AND METHOD FOR MANUFACTURING A DEVICE WITH THE SELF-ALIGNING PICK-UP HEAD

(71) Applicant: Infineon Technologies AG, Neubiberg (DE)

(72) Inventors: Horst Groeninger, Maxhuette (DE); Konrad Roesl, Teublitz (DE)

(73) Assignee: Infineon Technologies AG, Neubiberg (DE)

( * ) Notice: Subject to any disclaimer, the term of this patent is extended or adjusted under 35 U.S.C. 154(b) by 27 days.

(21) Appl. No.: 13/722,834

(22) Filed: Dec. 20, 2012

(65) Prior Publication Data

US 2014/0174652 A1 Jun. 26, 2014

(51) Int. Cl.
| | |
|---|---|
| *A47J 45/00* | (2006.01) |
| *B25J 15/06* | (2006.01) |
| *H01L 21/67* | (2006.01) |
| *H01L 21/683* | (2006.01) |

(52) U.S. Cl.
CPC ....... *B25J 15/0616* (2013.01); *H01L 21/67132* (2013.01); *H01L 21/6838* (2013.01); *Y10T 29/494* (2015.01)

(58) Field of Classification Search
CPC . B25J 15/0616; B65G 47/91; H01L 21/6838; H01L 2924/00; H01L 21/67132; B66C 1/0212; B66C 1/0293; H05K 13/0408; B25B 11/005; B25B 11/007; Y10S 269/903; B23Q 1/032; F16B 47/00; F16B 47/006; F16M 13/022; F16M 13/02; F16M 13/00; Y10T 29/494

USPC ............... 294/183, 64.2, 188, 65; 414/752.1; 248/205.5, 205.8, 205.9; 269/20, 21; 901/30, 40

See application file for complete search history.

(56) References Cited

U.S. PATENT DOCUMENTS

| | | | | |
|---|---|---|---|---|
| 3,223,442 | A * | 12/1965 | Fawdry et al. | ................. 294/189 |
| 3,711,142 | A * | 1/1973 | Wolski | ........... 294/183 |
| 4,491,306 | A * | 1/1985 | Eickhorst | ......... 269/21 |
| 5,092,572 | A | 3/1992 | Litwak et al. | |
| 5,172,922 | A * | 12/1992 | Kowaleski et al. | ............... 279/3 |
| 5,590,870 | A | 1/1997 | Goellner | |
| 5,957,445 | A | 9/1999 | Hagman et al. | |
| 6,012,711 | A | 1/2000 | Cipolla | |
| 7,398,735 | B1* | 7/2008 | Sunderland | ..................... 104/10 |
| 7,511,382 | B2 | 3/2009 | Riedl et al. | |
| 8,037,918 | B2 | 10/2011 | Wang et al. | |
| 8,181,948 | B2* | 5/2012 | Blick et al. | ...................... 269/21 |
| 8,246,025 | B2 | 8/2012 | Yamamura et al. | |
| 8,267,367 | B2* | 9/2012 | Cho | ............................ 248/363 |
| 2003/0151184 | A1 | 8/2003 | Wiebe | |
| 2008/0054541 | A1 | 3/2008 | Dixon et al. | |
| 2009/0184449 | A1 | 7/2009 | Drees | |
| 2012/0060603 | A1* | 3/2012 | Bork | .............................. 73/460 |
| 2012/0083392 | A1* | 4/2012 | Taranto | .......................... 482/98 |
| 2014/0123454 | A1 | 5/2014 | Mohamed et al. | |

FOREIGN PATENT DOCUMENTS

DE 10 2004 021 633 B4 4/2006

* cited by examiner

*Primary Examiner* — Stephen Vu
(74) *Attorney, Agent, or Firm* — Slater & Matsil, L.L.P.

(57) ABSTRACT

A self-aligning pick-up head, a method to manufacture a pick-up head and a method of manufacturing a device are disclosed. In one embodiment a pick-up head includes a nozzle having a first end portion and a second end portion and a base tool comprising a collet head, wherein the first end portion of the nozzle is gimbaled to the base tool.

17 Claims, 8 Drawing Sheets

SELF-ALIGNING PICK-UP HEAD AND METHOD FOR MANUFACTURING A DEVICE WITH THE SELF-ALIGNING PICK-UP HEAD

TECHNICAL FIELD

The present invention relates generally to pick-up heads for fabricating micro-electronic devices, and in particular to a self-aligning pick-up heads for die bonding.

BACKGROUND

In cost-effective high volume manufacturing of semiconductor devices a plurality of components is generally built in or built on silicon wafers which after completion of FEOL processing are cut up into individual units, termed "dies" or "chips." During the subsequent stages of packaging and assembly incorporation of a die into a protective package or integration to more complex electronic systems may occur. Bonding the die to a carrier substrate may be established via a solder layer or an adhesive layer. Mounting a die at its assigned bonding location on the substrate requires high precision robotic systems. Typically, a die pick-up device picks up a die, moves the die accurately above the bonding site of the carrier, and places the die onto the carrier.

SUMMARY OF THE INVENTION

In accordance with an embodiment of the present invention, a pick-up head comprises a nozzle comprising a first end portion and a second end portion and a base tool comprising a collet head, wherein the first end portion of the nozzle is gimbaled to the base tool.

In accordance with an embodiment of the present invention, a self-aligning pick up head comprises a base tool comprising a first main surface, a second main surface and a recess with at least a portion of a spherical surface. The self-aligning pick-up head further comprises a nozzle comprising at least a portion of a spherical surface and a first end portion, a cover mounted on the first main surface of the base tool, wherein the portion of the spherical surface of the nozzle is placed on the portion of the spherical surface of the recess, and wherein the first end portion of the nozzle is movable relative to the base tool.

In accordance with an embodiment of the present invention, a method for manufacturing a self-aligning pick-up head comprises placing at least one pin in a spherical end portion of a nozzle and connecting the nozzle to a base tool by mounting a cover on a first main surface of the base tool such that the nozzle is gimbaled relative to the base tool.

In accordance with an embodiment of the present invention, a method for manufacturing a device comprises picking-up a die with a self-aligning pick-up head and placing the die on a die carrier. The method further comprises bonding the die to the die carrier and encapsulating the die.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a die pick-up head for a die bonding tool. Embodiments of the invention may also be applied, however, to other pick-up heads such as component or electronic device pick-up heads.

A conventional pick-up head comprise a nozzle mechanically fixed to a collet head (a two piece pick up head). Such a pick-up head can only move in a single direction. The pick-up head is not self-aligning and/or flexible to pick up dice.

A problem with the conventional pick-up head is that voids may be formed between the die and the die carrier when the die is placed on the carrier. The voids may occur as the result of air trapped within the bonding layer or as a "blow off" of bonding material at the edges of the die due to air released from farther inside regions of the bonding layer. Moreover, the voids may occur because of a non-uniform distribution of the bonding material over the bonding area or a non-uniform downward pressure of the pick-up head. The issues of void formation and non-uniformity of the bonding layer become more critical with increased die size.

Embodiments of the present invention provide a self-aligning pick-up and a bonding tool with a self-aligning pick-up head. Embodiments of the present invention provide a gimbaled pick-up head. In various embodiments the self-aligning pick-up head comprise a nozzle, a base tool and a collet head (a three piece pick up head). In other embodiments the self-aligning pick-up head comprises a nozzle and a base tool with an integrated pick up head (a two piece pick up head).

Embodiments for the present invention further provide a method for manufacturing a device applying the self-aligning pick-up head. For example, a die may be bonded to a die carrier by soft soldering, diffusion soldering or adhesive bonding using the self-aligning pick-up head. The self-aligning pick-up head may be used for any chip size or any package type.

An advantage of the self-aligned pick-up head is a uniform force distribution while bonding the chips. In various embodiments a force of up to 10 kg×m/s$^2$ can be applied.

Figure 1A:
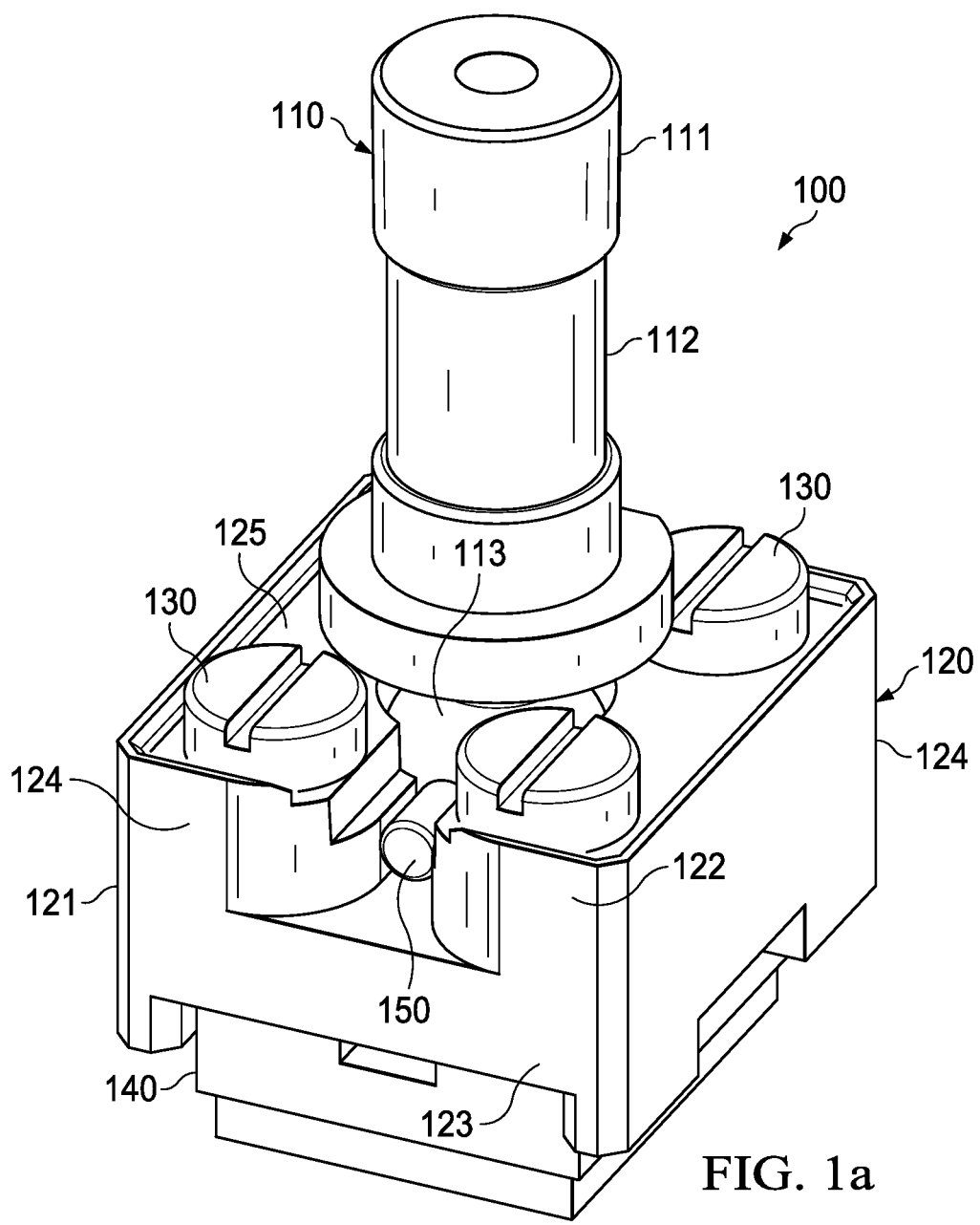
FIG. 1a shows a projection view of an embodiment of a self-aligning pick-up head without a cover.
Figure 1B:
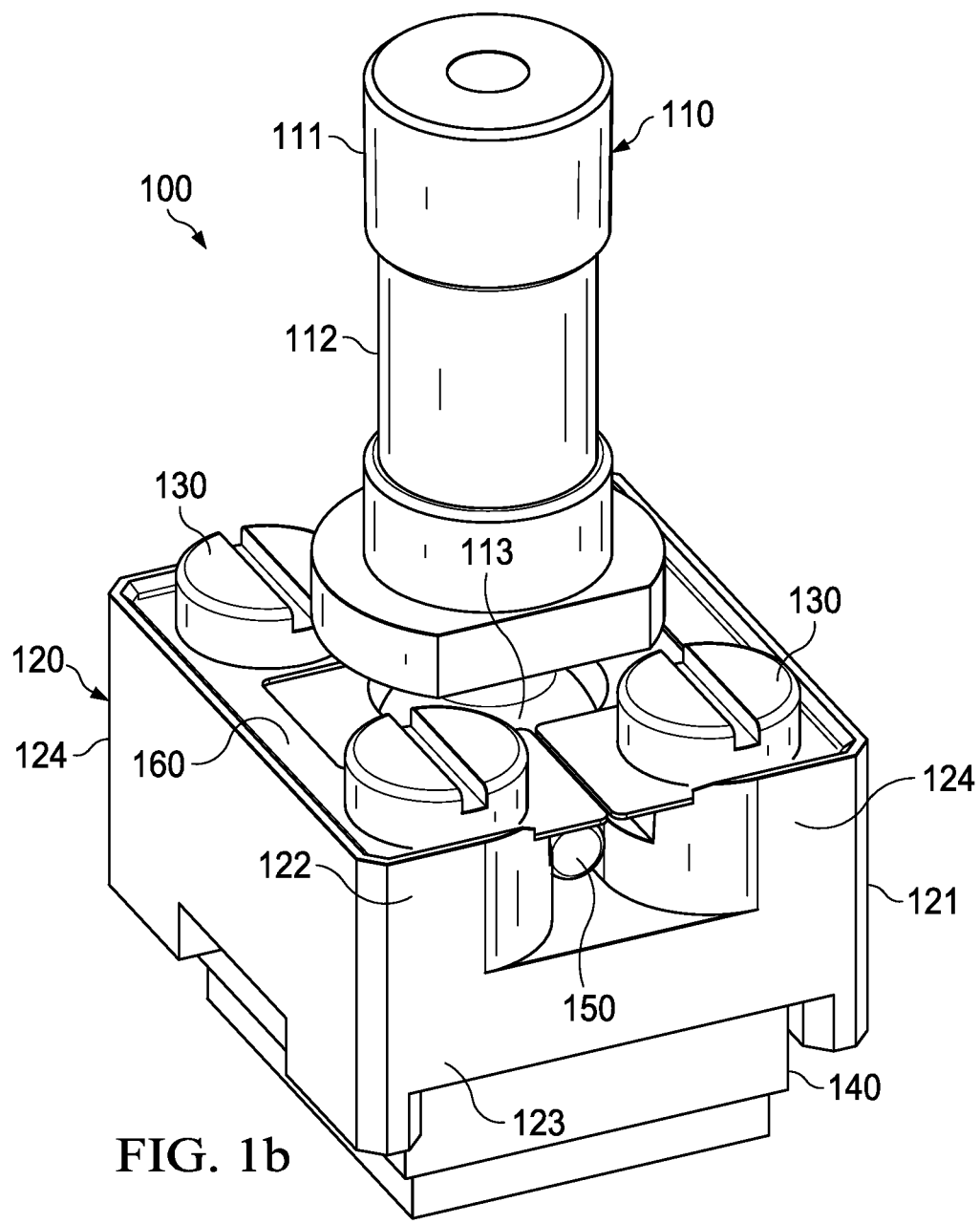
FIG. 1b shows a projection view of an embodiment of a self-aligning pick-up head with a cover and releasable fixing means.
Figure 1C:
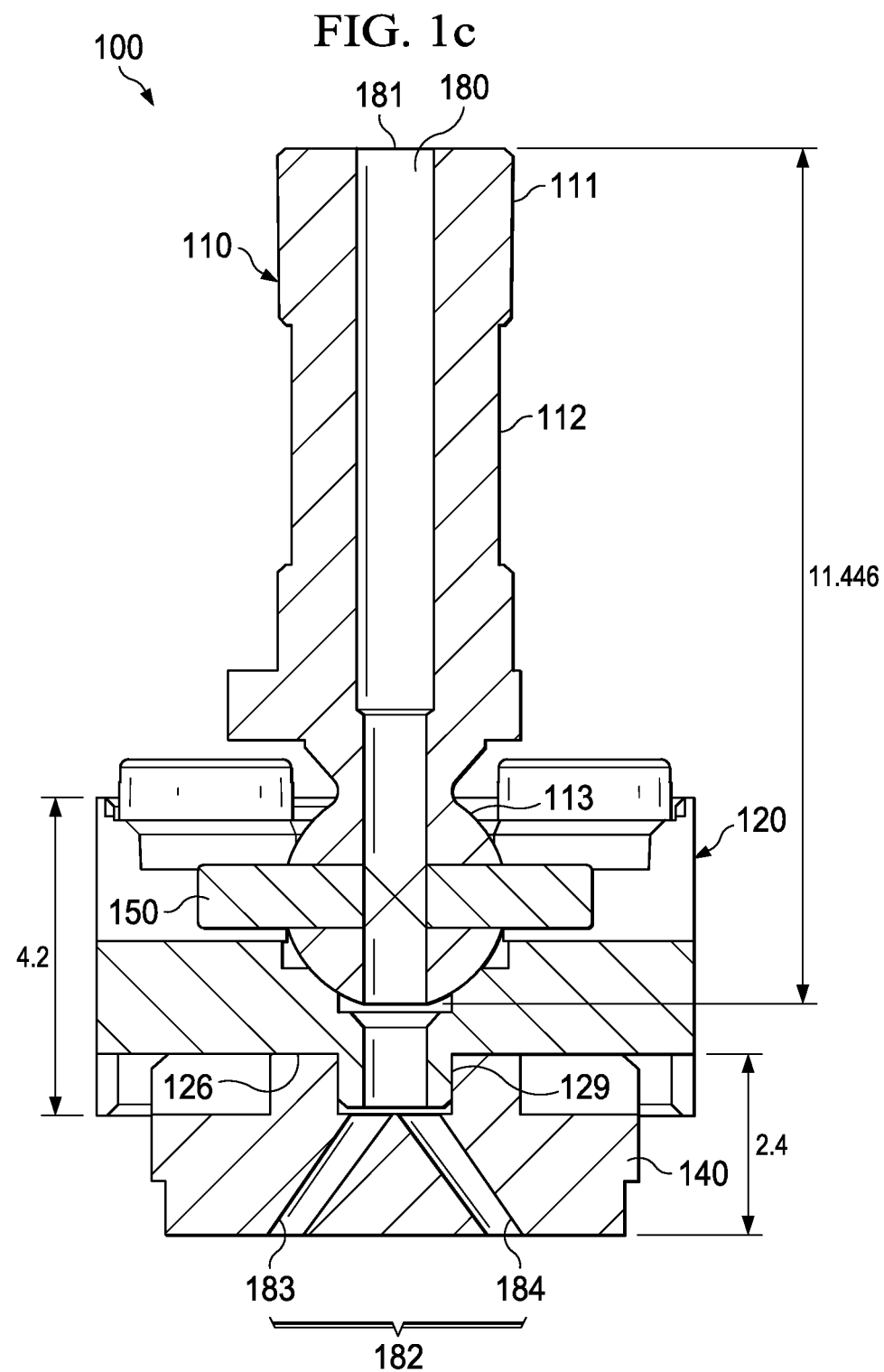
FIG. 1c shows a top view of an embodiment of a self-aligning pick-up head with dimensions.

FIGS. 1a and 1b show a projection views of an embodiment of a self-aligning pick-up head 100 and FIG. 1c shows a top view. The self-aligning pick-up head 100 comprises a nozzle 110, a base tool 120 and a device tool or collet head 140. The nozzle 110 may be cylindrical and its diameter may vary over its length. A first end portion 111 may comprise a cylinder with a larger diameter than the central portion 112. Alternatively, the first end portion 111 comprises a smaller diameter than the central portion 112. The first end portion 111 is configured to be received by a bonding tool. A second end portion 113 comprises a sphere or ball. Alternatively, the second end portion 113 comprises a geometrical element so that the nozzle 110 can be tilted against the base tool 120, e.g., a hemisphere. The nozzle 110 may comprise a metal such as iron or steel. As can be seen in FIG. 1c, the nozzle 110 may comprise a length of about 10 mm to about 15 mm, and in a particular example 11.446 mm.

The second end portion 113 is located in the base tool 120. The second end portion 113 is hinged or gimbaled to the base tool 120.

The base tool 120 may comprise a rectangular frame 121. Alternatively, the base tool 120 may comprise a circle frame, a square frame, an oval frame or any other geometrical suitable frame 121. The base tool 120 comprises a top portion 122 and a bottom portion 123. The top portion 122 comprises a guidance 128 such as a center recess configured to receive the second end portion 113 of the nozzle 110. The guidance 128 is configured to receive the second end portion 113 may extend into the bottom portion 123 of the base tool 120.

The top portion 122 of the base tool 120 comprises a mounting device 124 configured to hold a cover 160 on the top surface 125 of the base tool 120. The mounting device 124 may extend into the bottom portion 123 of the base tool 120. The mounting device 124 is configured to receive releasable fixing means 130 such as screws (e.g., countersink screw or flat head screw) or releasable pins. Alternatively, the mounting device 124 is configured to receive non-releasable fixing means 130 such as pins or rivets. The alternative embodiment with the non-releasable fixing means is shown in FIG. 1g. All other elements of FIG. 1g are the same as those in FIG. 1b.

The bottom portion 123 of the base tool 120 comprises also a center recess 126 configured to receive the device tool 140. The base tool 120 may comprise a metal such as iron or steel, or a plastic. The material of the base tool 120 and the nozzle 110 may be the same. The base tool 120 may comprise a length of about 3 mm to about 7 mm, and in a particular example 4.2 mm.

A pin or rivet 150 may be disposed in the second end portion 113 of the nozzle 110. The pin 150 may comprise a metal such as iron or steel. The material of the pin 150 and the material of the nozzle 110 and/or base tool 120 may be the same. The pin 150 may comprise a length of about 2 mm to about 4 mm, and in a particular example 2.3 mm. The pin 150 may comprise a diameter of about 0.5 mm to about 1 mm, and in a particular example 0.8 mm.

The self-aligning pick-up head 100 further comprises a device tool or collet head 140. The collet head 140 may be clamped into the bottom portion 123 of the frame 121 of the base tool 120. Alternatively, the device tool 140 is tight fitted or press fitted into the bottom portion 123 of the frame 121 of the base tool 121. The device tool 140 may be releasably or non-releasably mounted in the base tool 120. The base tool 120 may comprise a groove to which the device tool 140 is aligned.

The device tool 140 is configured to pick up devices such as electronic devices and/or semiconductor devices. The device tool 140 may comprise a plastic. The device tool 140 may comprise a length of about 1 mm to about 4 mm, and in a particular example 2.4 mm. In various embodiments the device tool 140 is integrated into the base tool 120 and part of that base tool 120.

As shown in FIG. 1b, a cover 160 is disposed over a top surface of the top portion 122 of the base tool 120. The cover 160 may a spring, e.g., a flat spring. In alternative embodiments, the cover 160 is a clip or compression tool.

The cover 160 is mounted on the top surface of the top portion 122 of the base tool 120. The cover 160 is configured to hold the second end portion 113 of the nozzle 110 in a hinged position. In various embodiments the edge of the cover 160 presses the second end portion 113 down into a guidance such as the recess 128 of the base tool 120. The cover 160 is mounted on the top surface via fixing means 130. FIGS. 1a and 1b show four fixing means, however there can be less than four (e.g., two fixing means) or more than four fixing means.

Figure 1D:
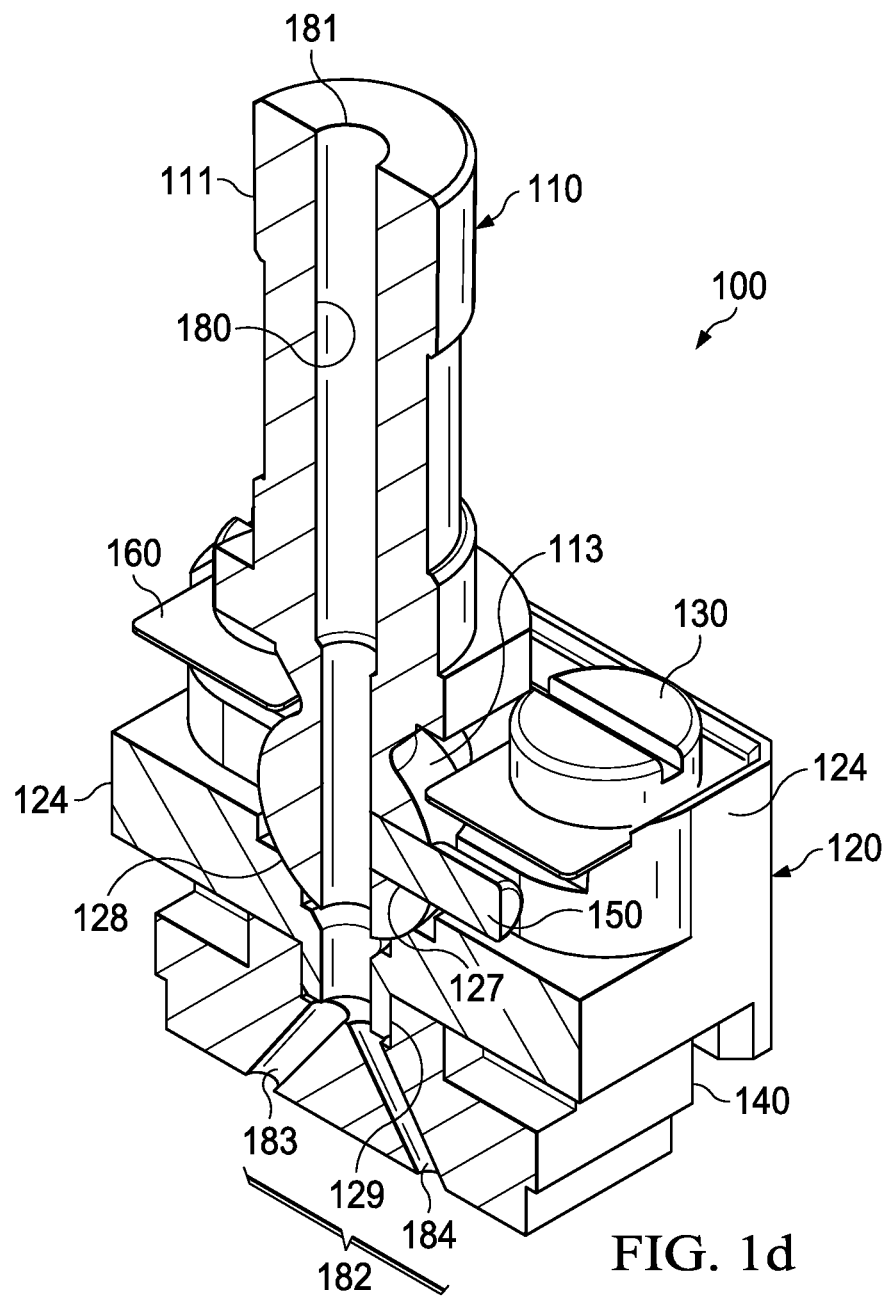
FIG. 1d illustrates a cross-section view of an embodiment of a self-aligning pick-up head with a single pin.

FIG. 1d shows a cross-sectional view of an embodiment of a self-aligning pick-up head 100. The self-aligning pick-up head 100 comprises a nozzle 110, a base tool 120 and a device tool 140. The nozzle 110 may be cylindrical and its diameter may vary over its length.

The self-aligning pick-up head 100 comprises a vacuum path 180 through the entire length of the head 100. A first opening 181 of the vacuum path is disposed in first end portion 111 of the nozzle 110. For example, the first opening 181 of the vacuum path is disposed in the middle of the top surface of the first end portion 111. A second opening 182 of the vacuum path 180 is disposed in the bottom surface of the collet head 140. The vacuum path of the self-aligning pick-up head 100 runs through nozzle 110, the second end portion 112 of the nozzle 110, the base tool 120 and the collet head 140. The vacuum path is hermetically sealed at the different connection points or joints, e.g., between the second end portion 112 of the nozzle 110 and the base tool 120 and between the base tool 120 and the collet head 140. The vacuum path 180 is configured to be connected to the vacuum path of the bonding tool and/or to a vacuum pump in the bonding tool. The vacuum pump in the bonding tool provides the under-pressure, the vacuum or the suction for picking-up the devices (e.g., chips).

In various embodiments the collet head 140 comprises two vacuum paths 183, 184 with two second openings 182. The vacuum path 180 may split into the two vacuum paths 183, 184 at a connection point between the collet head 140 and the base tool 120. Alternatively, the vacuum path 180 split into two vacuum paths 183, 184 at a distance from a top surface of the collet head 140. In various embodiments, the vacuum path 180 remains a single path and may not split into several vacuum paths. In various embodiments, the vacuum path 180 may split in a more than two vacuum paths' such as three or four vacuum paths. In some embodiments the split of the vacuum path 180 is based on the size of the device to be picked up (e.g., a semiconductor device). Larger devices may require more paths than smaller devices.

The cross sectional view of FIG. 1d also shows how the second end portion 113 of the nozzle 110 sits in the base tool 120. The second end portion 113 sits in a guidance 128 (e.g., recess or cavity) in the bottom portion 123 of the base tool 120. The base tool 120 may comprise a protrusion 129 extending away from the bottom surface of the bottom portion 123 of the base tool 120. The mounting devices 124, fixing means 130 and a portion of the cover 160 can also be seen.

The second end portion 113 comprises a channel 127. The channel 127 may be disposed orthogonally to the vacuum path 180. The channel 127 is configured to receive a pin 150.

The pin 150 seals the vacuum path 180. The pin 150 extends outside the surface of the second end portion 113 or a portion of the pin 150 remains outside the surface of the second end portion 113.

Figure 1E:
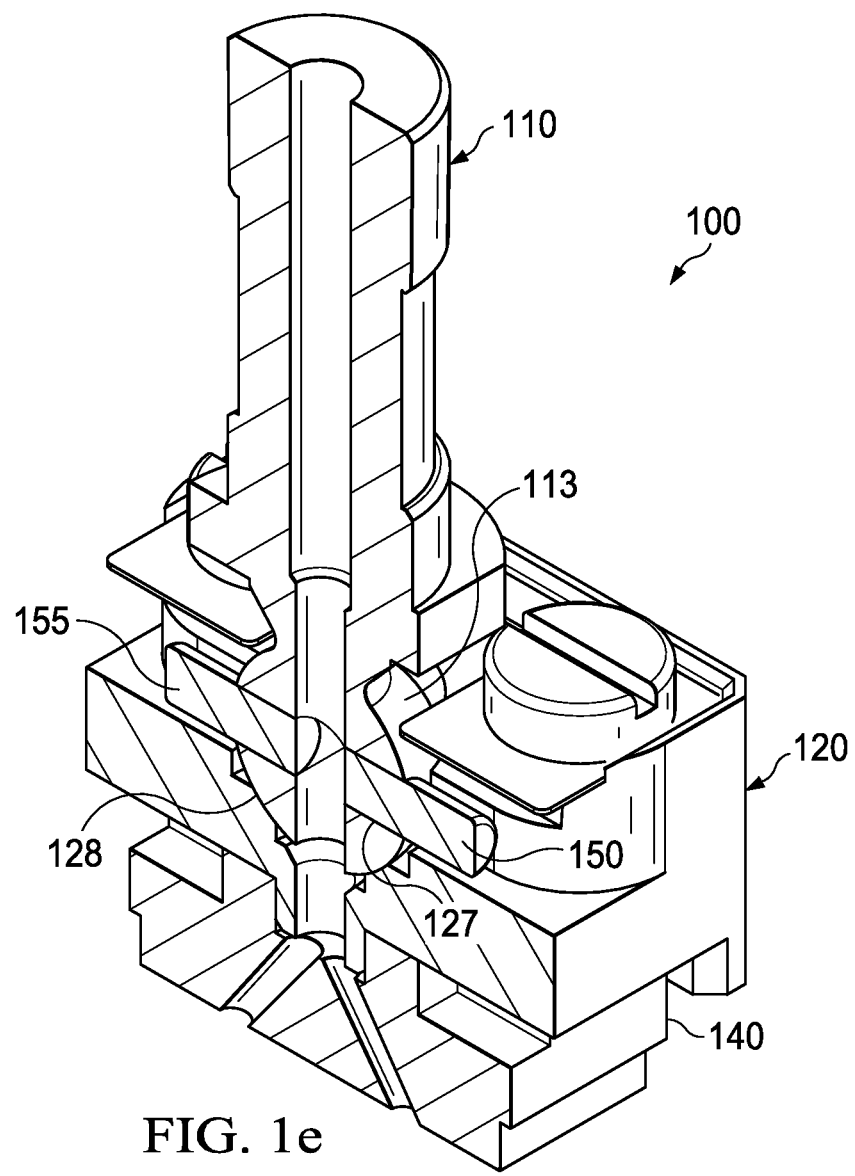
FIG. 1e illustrates a cross-section view of an embodiment of a self-aligning pick-up head with two pins.

FIG. 1e shows a cross-sectional view of another embodiment of a self-aligning pick-up head 100. The self-aligning pick-up head 100 comprises a nozzle 110, a base tool 120 and a device tool 140. In this embodiment the second end portion 113 comprises two channels 128. The channels 127, 128 may be disposed orthogonally to the vacuum path 180. Each channel 127, 128 is configured to receive a pin 150, 155. The pins seal the vacuum path 180. Each pin 150, 155 extends outside the surface of the second end portion 113 of the nozzle 110. In some embodiments, the self-aligning pick-up head 100 may comprise more than two pins, e.g., four pins.

Figure 1F:
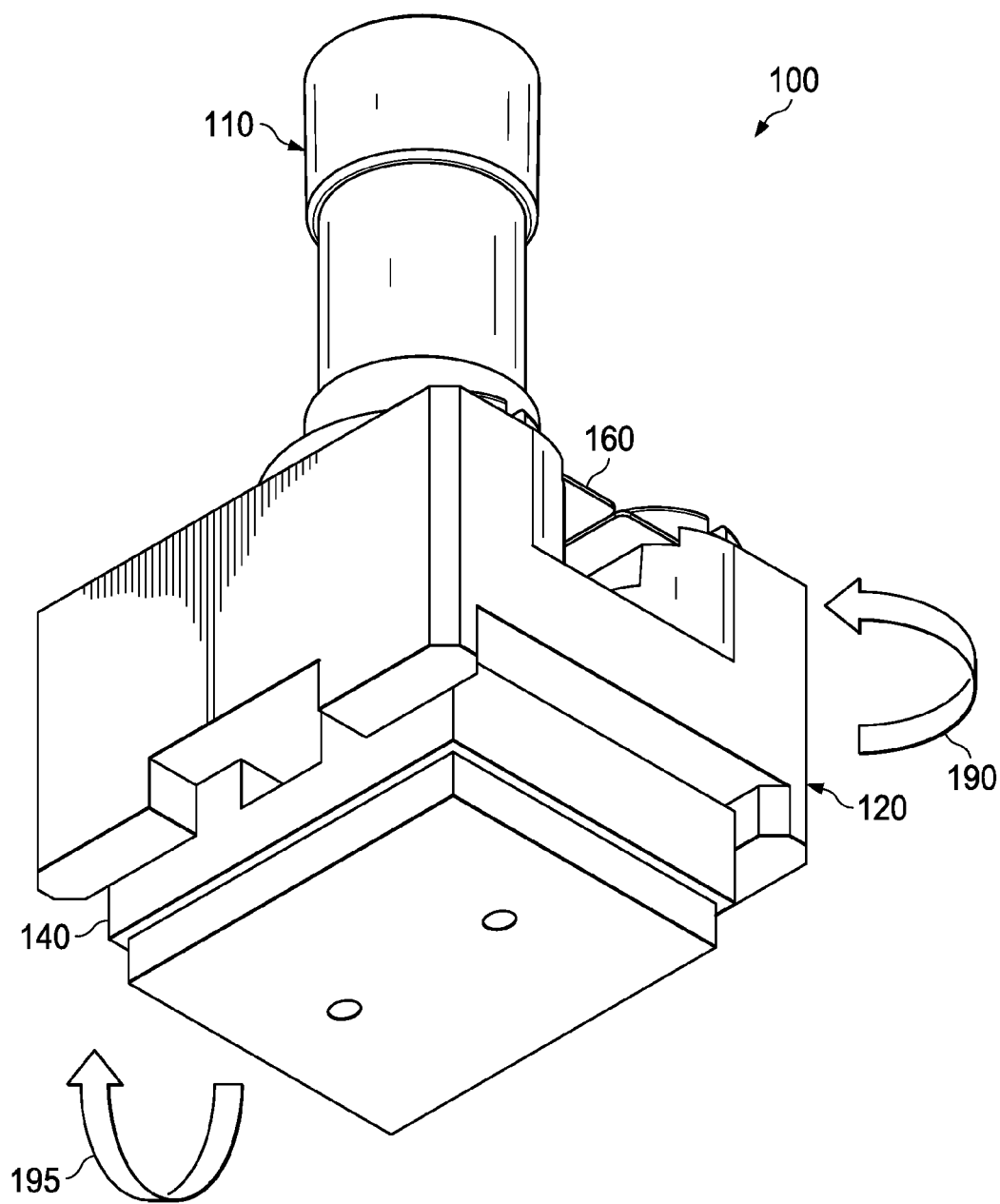
FIG. 1f shows a projection view of an embodiment with a self-aligning pick-up head exhibiting movable directions of the head.
Figure 1G:
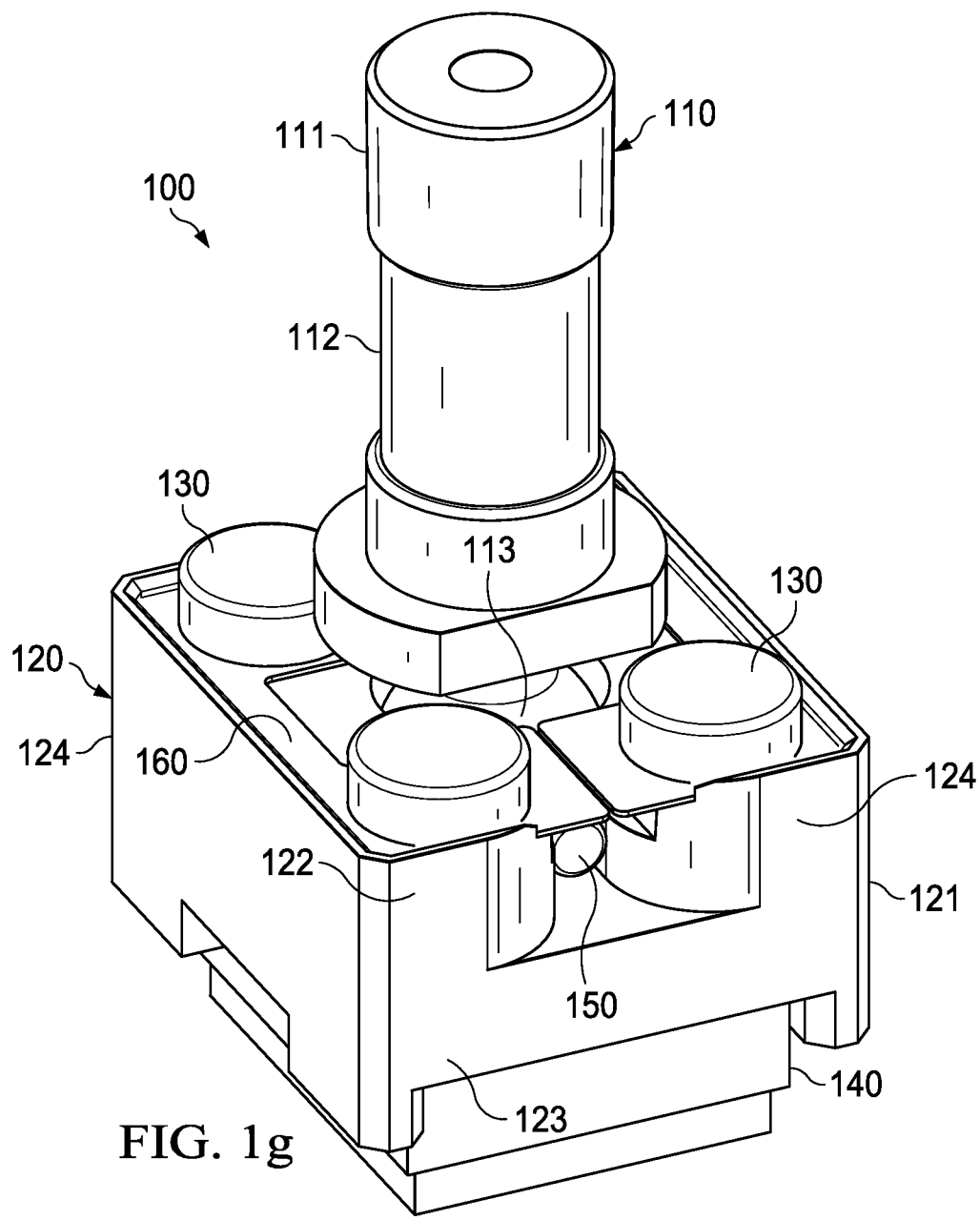
FIG. 1g shows a projection view of an embodiment of a self-aligning pick-up head with a cover and non-releasable fixing means.

FIG. 1f shows an embodiment of a self-aligning pick-up head 100 being self-aligning or configured to be self-aligning in a three dimensional manner.

The self-aligning pick-up head 100 can be tilted in a first direction 190 and in a second direction. In particular, the base tool 120 and the collet head (device tool) 140 can be tilted relative to the nozzle 110 in a first direction 190 (first plane) and in a second direction 195 (second plane).

In an assembled state the base tool 120 and the nozzle 110 form a joint configured to provide a gimbal. The second end portion 113 of the nozzle (see FIGS. 1c and 1d) is placed in the guidance 128 of the base tool 120 forming a three-dimensional tiltable connection. The cover 160 keeps the second end portion 113 of the nozzle 110 in the guidance 128 but allows tilting. Moreover, the pressure provided by the cover 160 seals the vacuum channel 180 at the interface. In various embodiments, the pin 150 limits the tilting between the second base tool 120 and the nozzle 110, because the movement of the pin is restricted by the cover 160, the bottom portion 123 (see FIG. 1d) and the sidewalls of the mounting device 124 (see FIG. 1d). In various embodiments the pin 150 is rotationally restricted axially to the nozzle 110.

The nozzle 110 is hinged, tiltable and/or pivotal connected, or gimbaled to the base tool 120 at the joint/interface. A first end 110 of the nozzle 110 may be placed in the base tool 120 and a second end of the nozzle 110 may be movable in any direction relative to the base tool 120. The cover 160 may limit the movement of the nozzle 110 relative to the base tool 120 in a first direction (first maximum tilting angle) by +/−10 degrees. Alternatively, the cover 160 limits the movement of the nozzle 110 by +/−5 degrees or even +/−1 degree. The pin (not shown) may limit the movement of the nozzle 110 relative to the base tool 120 in a first direction and/or a second direction (second maximum tilting angle) by +/−10 degrees. Alternatively, the pin may limit the movement of the nozzle 110 relative to the base tool by +/−5 degrees or even +/−1 degree.

Figure 2:
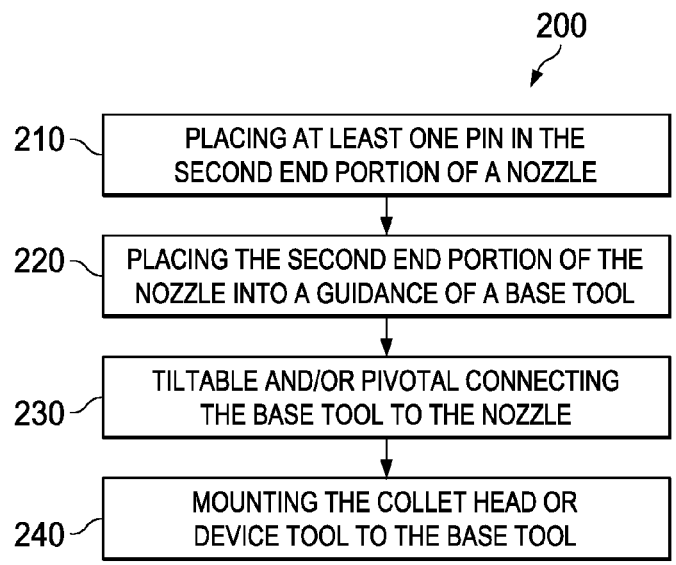
FIG. 2 shows an embodiment of a method for manufacturing a self-aligning pick-up head.

FIG. 2 shows a flow chart 200 of an embodiment of a method for manufacturing a self-aligning pick-up head. In step 210, at least one pin is placed into a second end portion of the nozzle. The nozzle comprises a vacuum path, a first end portion configured to be placed in a bonding tool and a second end portion configured to be placed in a base tool. The second end portion comprises a surface along which another base tool can be tilted or pivoted. For example, a single pin is placed in a sphere or ball of the second end portion of the nozzle as shown in the embodiment of FIG. 1c. Alternatively, two pins are place in the sphere or ball of the second end portion of the nozzle as shown in the embodiment of FIG. 1d.

In step 220, the second end portion of the nozzle is placed into a guidance, e.g., a recess or cavity of the base tool. The second end portion of the nozzle is placed in the base tool such that the pin can be moved orthogonally to the longitudinal (or axial) direction of the nozzle by about +/−10 degrees and such that the nozzle can be moved without movement of the base tool.

In step 230, tiltable and/or pivotal connecting the nozzle to the base tool. For example, a cover is placed on the top surface and fixed so that the nozzle is hinged, tiltable and/or pivotal connected or gimbaled to the base tool. The cover may be releasably mounted on the base tool using fixing means such as screws for example. Alternatively, the cover is fixed on the base tool using fixing means such as pins. The cover (by pressing the second end portion of the nozzle towards the guidance) seals the vacuum path and in particular the interface of the vacuum path.

In step 240, the collet head or device tool is mounted on the base tool. The collet head or device tool is configured to pick up the device, e.g., an electronic component or a semiconductor chip/die. In alternative embodiments the collet head or device tool may be mounted to the base tool before the nozzle is connected to the base tool. The collet head or device tool is mounted into the base tool such that the interface between the device tool and the base tool of the vacuum path is sealed. In various embodiments the device tool is clamped, press fitted or tight fitted in the base tool. In other embodiments the device tool is part of the base tool.

Figure 3:
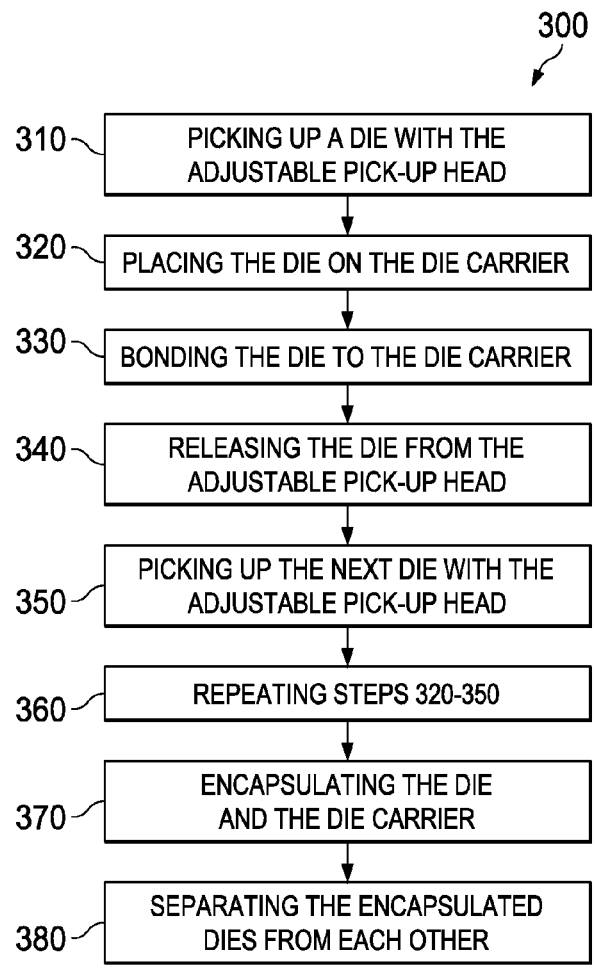
FIG. 3 shows an embodiment of the method for manufacturing a device using a self-aligning pick-up head.

FIG. 3 shows a flow chart 300 of an embodiment of a method for manufacturing a device such as a semiconductor package.

In a first step 310, a die or chip is picked up from a dicing foil, a shuttle conveyer or another surface. The die or component may comprise a discrete device such as a single semiconductor device or an integrated circuit (IC). For example, the die may comprise a semiconductor device such as a MOSFET or a power semiconductor device such as a bipolar transistor, an insulated gate bipolar transistor (IGBT), or a power MOSFET. Alternatively, the die may comprise a thyristor or a diode. Moreover, the die may be a resistor, a protective device, a capacitor, a sensor or a detector, for example. In some embodiments the die may be a system on chip (SoC).

In one embodiment the die comprises a single transistor having a top surface comprising a source and/or a gate, and a bottom surface comprising a drain. Alternatively, the top surface comprises a drain and/or a gate and the bottom surface comprises a source.

In one embodiment the die comprises a substrate such as a semiconductor substrate. The semiconductor substrate may be silicon or germanium, or a compound substrate such as SiGe, GaAs, InP, GaN or SiC, or alternatively, other materials. The substrate may be doped or undoped and may comprise one or more wells.

In one embodiment the die comprises a metal layer on its bottom surface. The metal layer is configured to be soldered to a die carrier. The metal layer may comprise barrier layers of Cr, V, or Ti upon which thin layers (0.1-10 μm) of Au (or Ag) and Ni are formed. The latter metal layers may ensure good wettability for soldering and for forming of strong metallurgical bonds (e.g. of Ni—Sn bonds).

The die is picked up with a bonding tool comprising the self-aligning pick up head according to embodiments of the invention. For example, the die is picked up by placing the collet head on or over the die. The die is picked up with the self-aligning pick-up head by applying vacuum suction through the vacuum path of the pick-up head.

In step 320 the die is placed on a die carrier. For example, the die is aligned with high accuracy over its assigned bonding site on the die carrier. The die carrier may be a leadframe or a printed circuit board (PCB). In one embodiment the die carrier is a metal lead frame comprising copper and nickel. The leadframe may further comprise gold (Au) disposed on the nickel (Ni).

The leadframe may comprise a die attach film. In one embodiment the die attach film may be a non-conductive adhesive such as a thin organic film comprising epoxy, polyimide or cyano ester compounds. The non-conductive adhesive may be applied to the leadframe by screen printing or stencil printing. Alternatively, the non-conductive adhesive is a foil. In another embodiment die attach film may be a conductive film. The conductive die attach film may comprise a base polymer of similar chemical nature as those of non-conductive adhesive films, and a 70-80% metal loading of highly conductive flakes of Ag, Ag-coated Cu, Ni or Au. Alternatively, a solder material may be disposed. A solder material may comprise AuSn, AgSn, CuSn, CuAuSn, PtIn, PdIn. The die attach film may be a conductive or non-conductive foil.

In one embodiment diffusion bonding is applied at a temperature between about 150° C. to about 250° C.

In step 330 the die is bonded to the die carrier. In one embodiment the die is bonded to the die carrier applying diffusion bonding. In preparation for die bonding the bonding site on the die carrier is brought up to a temperature of about 220° C. to about 400° C. For example, the substance may pass through an indexer tunnel of a hot die attach machine. The carrier may pass through an indexer tunnel comprising several (e.g. 8) heating zones thereby gradually increasing the bonding temperature (e.g. 360° C.), stabilizing the bonding temperature, and cooling down the temperature after die bonding. In order to prevent oxidation of the solder or metallization films the indexer tunnel may be filled with reducing forming gas atmosphere.

The actual die-to-substrate bonding is carried out by lowering the collet head to bring the die in physical contact to the die carrier. This downward movement of the collet head is slowed down over a period of approximately 300 ms (so-called bond soften delay) to allow preheating of the die backside of the die prior to bonding. After the end of the bond soften delay a slight further downward movement of the collet head occurs while applying controlled pressure provided by a pneumatic system of the bonding tool. The bonding force to be applied depends on the chip size. Typical bonding force values for diffusion soldering are in the range of 50-100 N. Alternatively about 3 N/mm² die size may be applied.

For bonding the die to the die carrier with an adhesive layers the applied bonding force can be significantly lower. For example, the applied bonding time, i.e. the time from the first die contact with the substrate to the release of the collet head from the die, ranges generally from 200-400 ms.

Because of its adjustability the self-aligning pick-up head can easily pick up even misalignment dies.

In step 340, the self-aligning pick-up head including the collet head is released from the die. For example, the vacuum is turned off and the collet head is moved up.

In step 350, the self-aligning pick-up head picks up the next die and in step 360 the bonding tool may repeat steps 320-350. The next die may undergo the same alignment and bonding procedures as the first die. Step 350 and 360 may be optional step since in some embodiments only one die is bonded to one die carrier.

After the contacts of the die(s) are connected via connection elements (wire bonds or metal clips) to the die carrier 370 the die(s) and the die carrier are encapsulated. The encapsulation material may be a molding compound, a laminate or a casing. The die(s) and the connection elements may be completely encapsulated, and the die carrier may be partially encapsulated. Alternatively, the die(s) may be completely encapsulated and at least one of the connection elements may be partially encapsulated.

In an optional step 380, the packaged or encapsulated dies may be singulated from each other by a cutting laser or cutting saw such that a packaged chip or die is manufactured.

The adjustability of the collet head provides an optimal contact between the bonding interface of an individual die and the surface of the corresponding bonding site on the die carrier. An advantage of using the self-aligning pick-up head is avoidance or the reduction of void formation. In particular, the self-aligning pick-up head may work well for die sizes exceeding 10 mm.

In one embodiment the pick-up head may work for any bonding application, irrespective of the nature of the bonding material. For example, the self-aligning pick-up head may be applied for bonding non-conductive adhesive wafer backside coatings, conductive adhesive backside coatings, solder materials or any type of diffusion solder material.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A pick-up head comprising:
    a base tool comprising:
        a first main surface;
        a second main surface; and
        a recess located between the first main surface and the second main surface,
    wherein the recess comprises at least a portion of a spherical surface;
        a nozzle comprising a first end portion having at least a portion of a spherical surface and a second end portion;
        a cover mounted on the first main surface of the base tool, wherein the cover retains the nozzle against the base tool; and
        a collet head mounted on the second main surface of the base tool, wherein the portion of the spherical surface of the nozzle is placed on the portion of the spherical surface of the recess, and wherein the base tool is movable relative to the second end portion of the nozzle.

2. The pick-up head according to claim 1, wherein the portion of the spherical surface of the nozzle comprises a first pin protruding out of the portion of the spherical surface.

3. The pick-up head according to claim 2, wherein the portion of the spherical surface of the nozzle comprises a second pin protruding out of the portion of the spherical surface.

4. The pick-up head according to claim 1, wherein a pin is configured to limit a movement of the second end portion of the nozzle relative to the base tool in any direction to +/−10 degrees.

5. The pick-up head according to claim 1, wherein the cover is a flat spring.

6. The pick-up head according to claim 1, wherein screws mount the cover to the base tool, and wherein bolts of the screws are located in a direction orthogonal to the first main surface in the base tool.

7. The pick-up head according to claim 1, wherein the nozzle, the base tool and the collet head comprise a vacuum path.

8. The pick-up head according to claim 7, wherein the vacuum path splits into two or more vacuum paths in the collet head.

9. A pick-up head comprising:
a base tool comprising:
a first main surface;
a second main surface; and
a recess located between the first main surface and the second main surface,
wherein the recess comprises at least a portion of a spherical surface; and
a nozzle comprising a first end portion having at least a portion of a spherical surface and a second end portion, wherein the portion of the spherical surface of the nozzle is placed on the portion of the spherical surface of the recess; and
a cover mounted on the first main surface of the base tool, where the cover holds the nozzle from a side from which the nozzle extends into the base tool, and wherein the base tool is movable relative to the second end portion of the nozzle.

10. The pick-up head according to claim 9, wherein the cover is a flat spring.

11. A pick-up head comprising:
a nozzle comprising a first end portion and a second end portion;
a base tool ;
a cover holding the nozzle such that a second end portion of the nozzle extends into the base tool, wherein the second end portion of the nozzle and the base tool form a tiltable connection, and wherein the cover is located on a first side of the base tool where the nozzle extends into the base tool; and
a collet head connected to the base tool, wherein the nozzle, the base tool and the collet head comprise a vacuum path, and wherein the collet head is located on a second side of the base tool that is not on a side where the nozzle extends into the base tool.

12. The pick-up head according to claim 11, wherein the base tool comprises a recess and wherein the second end portion of the nozzle is located in the recess.

13. The pick-up head according to claim 11, wherein the cover is a flat spring fixed to the base tool by releasable pins or releasable screws.

14. The pick-up head according to claim 11, wherein the cover is a flat spring fixed to the base tool by non-releasable pins or non-releasable rivets.

15. The pick-up head according to claim 11, wherein the second end portion of the nozzle comprises a sphere, and wherein a first pin is protruding from the sphere.

16. The pick-up head according to claim 15, wherein a second pin is protruding from the sphere.

17. The pick-up head according to claim 11, wherein the vacuum path splits into two or more vacuum paths in the collet head.

* * * * *